(12) United States Patent
Chiu

(10) Patent No.: US 12,010,814 B2
(45) Date of Patent: Jun. 11, 2024

(54) LIQUID IMMERSION COOLING SHEET WITH IMPROVED SURFACE STRUCTURE

(71) Applicant: TAIWAN MICROLOOPS CORP., New Taipei (TW)

(72) Inventor: Chun-Teng Chiu, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 106 days.

(21) Appl. No.: 17/725,208

(22) Filed: Apr. 20, 2022

(65) Prior Publication Data

US 2023/0345667 A1   Oct. 26, 2023

(51) Int. Cl.
*H05K 7/20* (2006.01)
(52) U.S. Cl.
CPC .................. *H05K 7/20236* (2013.01)
(58) Field of Classification Search
CPC ........... H05K 7/20236; H05K 7/20263; H05K 7/20927; H05K 7/20809; H05K 7/20254; H01L 23/44; H01L 23/473; G06F 2200/201; G06F 1/20

See application file for complete search history.

(56) References Cited

U.S. PATENT DOCUMENTS

| | | | |
|---|---|---|---|
| 2019/0246518 A1* | 8/2019 | Shen | G06F 1/20 |
| 2022/0007542 A1* | 1/2022 | Jeong | H01L 23/3736 |
| 2023/0253288 A1* | 8/2023 | Adebiyi | H01L 25/0655 |
| | | | 257/687 |

* cited by examiner

*Primary Examiner* — Frantz F Jules
*Assistant Examiner* — Martha Tadesse
(74) *Attorney, Agent, or Firm* — Chun-Ming Shih; HDLS IPR SERVICES

(57) ABSTRACT

A liquid immersion cooling sheet includes a metal case and a porous structure. The metal case has a heated surface and a cooling surface formed on a back of the heated surface. The porous structure is disposed on the cooling surface and has multiple gaps. A width of each gap is less than or equal to about 0.2 mm. Therefore, the waste heat from an electronic heat source may be rapidly dissipated.

3 Claims, 6 Drawing Sheets

LIQUID IMMERSION COOLING SHEET WITH IMPROVED SURFACE STRUCTURE

BACKGROUND

Technical Field

The disclosure relates to a cooling sheet, particularly to a liquid immersion cooling sheet with an improved surface structure.

Related Art

With the flourishing development and applications of the network technology, users have higher and higher requirements for the booting speed of computers, the reading speed of software and the playing speed of pictures and videos. Effectively saving time is one of the conditions for a customer to select a product.

With the increase of the performance and the reading speed, heat and temperature from electronic elements also continuously rise. High temperature not only makes aging of most components speed up, but also makes the reading and writing speed of an electronic element such as a hard disk drive slow down. Thus, how to keep the working temperature is an issue of the disclosure.

A cooler used for the electronic element includes a heat conduction plate and multiple fins on the heat conduction plate. The cooling effect can be implemented by the thermal contact between the heat conduction plate and the electronic element, and air as a heat conduction medium. However, the thermal conductivity of air is too low to have good efficiency of heat conduction. Although there is a liquid immersion cooler in the market, the heat to be dissipated is limited by its structure, so current using demands cannot be satisfied.

In view of this, the inventors have devoted themselves to the above-mentioned related art, researched intensively and cooperated with the application of science to try to solve the above-mentioned problems. Finally, the invention which is reasonable and effective to overcome the above drawbacks is provided.

SUMMARY

An object of the disclosure is to provide a cooling sheet with an improved surface structure for cooling a heat source in a liquid immersion manner, which may rapidly dissipate the waste heat from an electronic heat source.

To accomplish the above object, the disclosure provides a liquid immersion cooling sheet with an improved surface structure, which includes a metal case and a porous structure. The metal case has a heated surface and a cooling surface formed on a back of the heated surface. The porous structure is disposed on the cooling surface and has multiple gaps. A width of each gap is less than or equal to about 0.2 mm.

The disclosure further has the following functions. By limiting the width of the gap in a specific range, there is much more cooling surface area in the same unit area, and the liquid may easily penetrate in or out to flow. The pins and the metal case are integratedly formed (or formed in one piece), so a desirable heat conduction performance is obtained. By the arrangement of the heat conduction plate, the manufacturing process becomes simple and easy.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
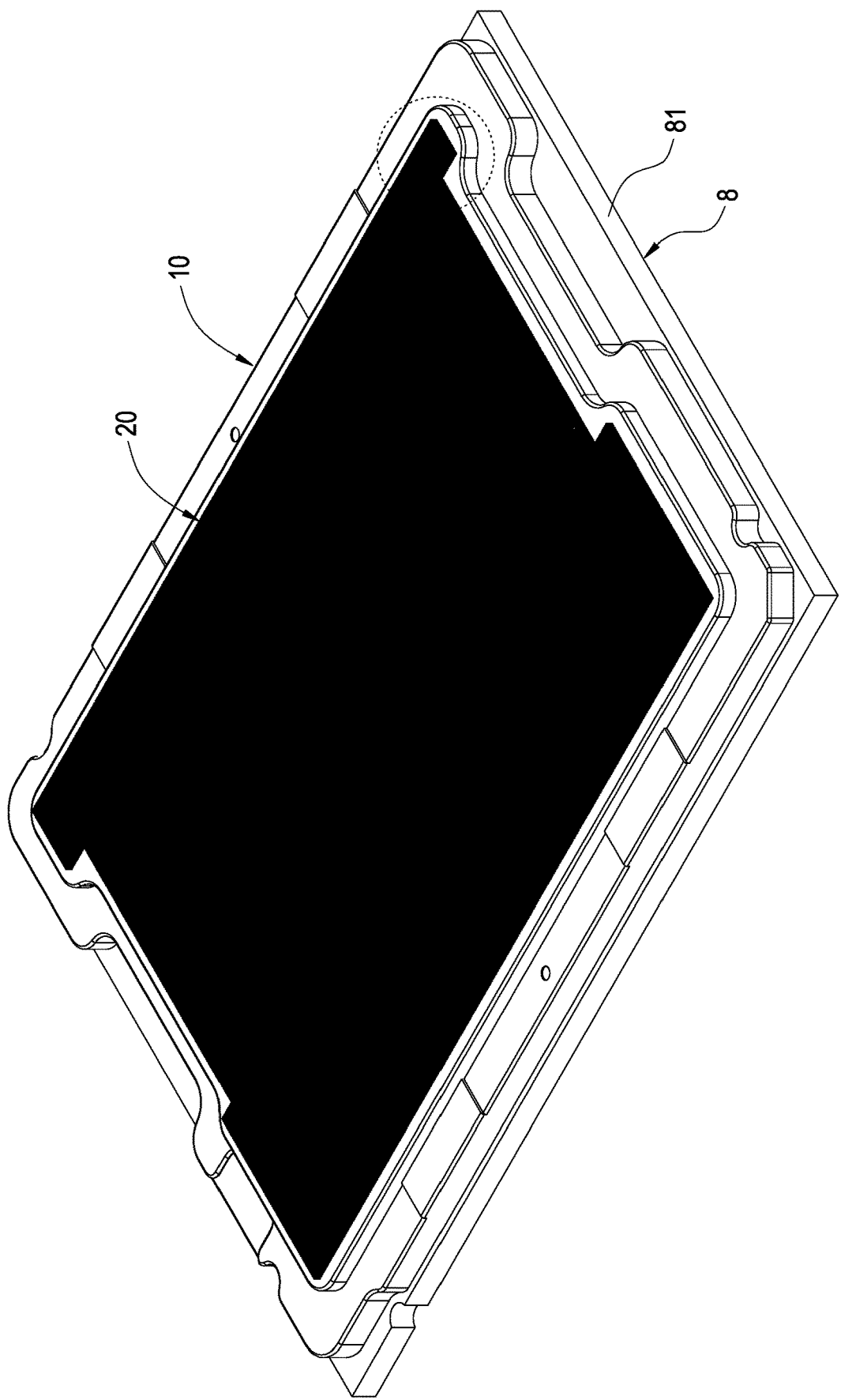
FIG. 1 is a perspective assembled view of the disclosure and an electronic element.
Figure 2:
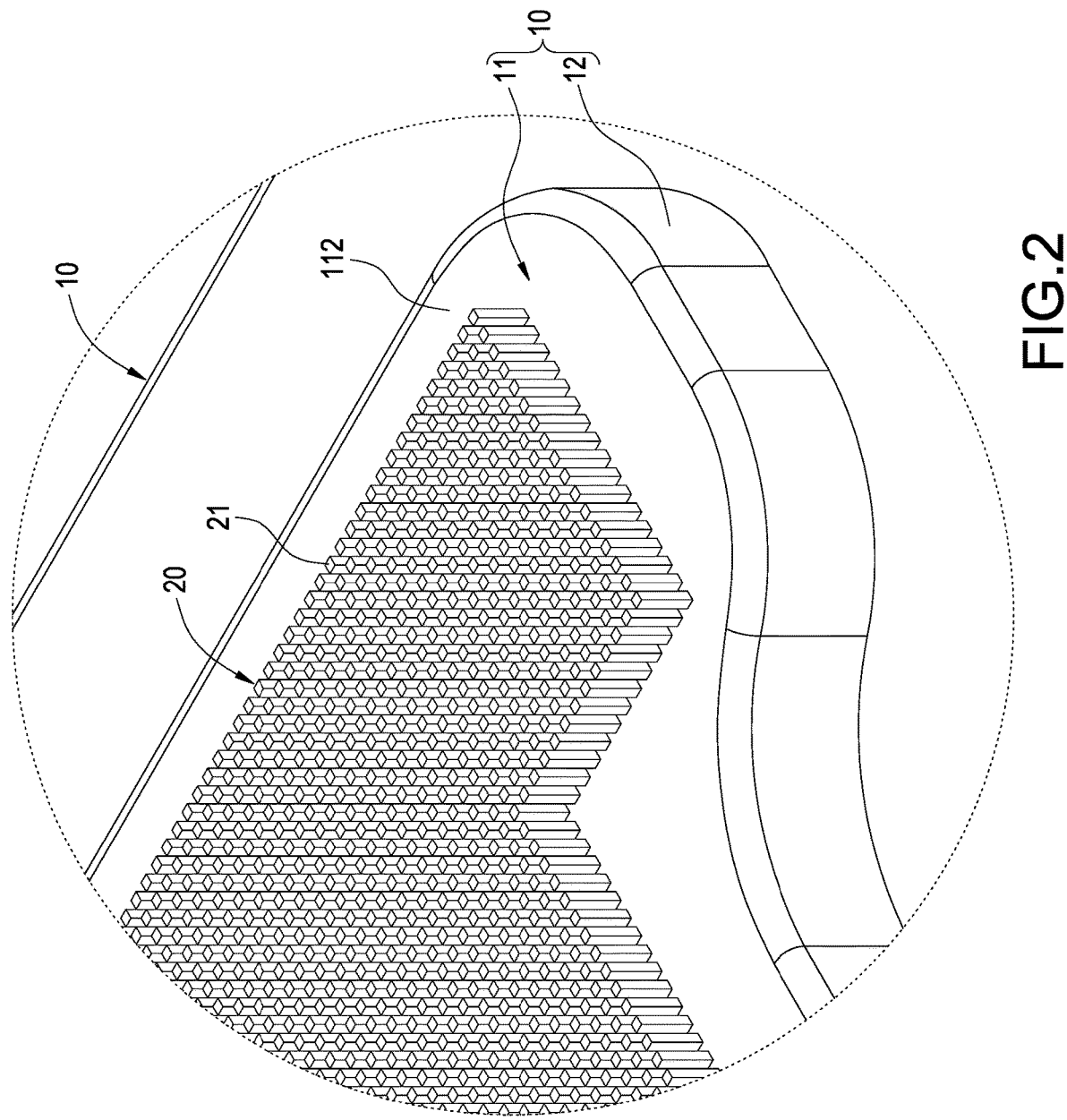
FIG. 2 is a partially enlarged view of FIG. 1.
Figure 3:
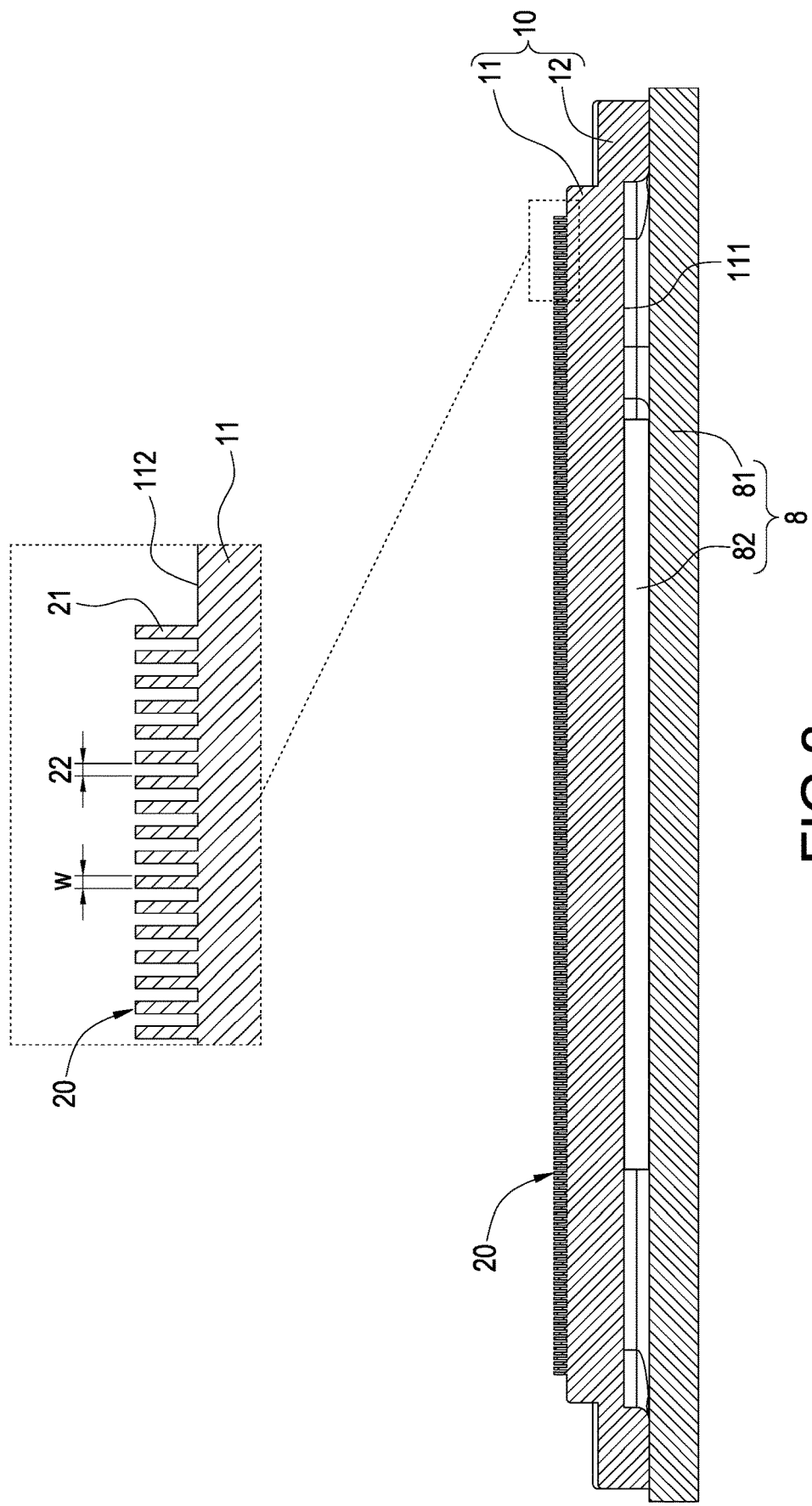
FIG. 3 is a cross-sectional view of the disclosure and an electronic element.

Please refer to FIGS. 1-3. The disclosure provides a cooling sheet with an improved surface structure for cooling a heat source in a liquid immersion manner, the cooling sheet includes a metal case 10 and a porous structure 20.

The metal case 10 is made of copper, aluminum, magnesium, or an alloy thereof and includes a substrate 11 and multiple side plates 12 downward extended from a periphery of the substrate 11. A lower surface of the substrate 11 has a heated surface 111. An upper surface of the substrate 11 has a cooling surface 112 which is formed on the back of the heated surface 111.

The porous structure 20 of the embodiment includes multiple pins 21. Each pin 21 is integrally formed (or formed in one piece) with the metal case 10 and extended from the cooling surface 112. A gap 22 is formed between any adjacent two of the pins 21. A width of each gap is less than or equal to about 0.2 mm. In some embodiments, a width of each gap is between about 0.05 mm and about 0.1 mm.

In an embodiment, the pin 21 may be a copper rod whose cross-section may be a circle or a rectangle. A diameter of the circular pin 21 is less than or equal to about 0.2 mm. A width of the rectangular pin 21 is less than or equal to about 0.2 mm.

Please refer to FIG. 3. The cooling sheet with the improved surface structure for cooling the heat source in a liquid immersion manner of the disclosure may be applied to an electronic element 8. The electronic element 8 includes a circuit board 81 and an electronic heat source 82 disposed on the circuit board 81. When assembling, the metal case 10 covers on the electronic heat source 82, each side plate 12 abuts against the circuit board 81, and a top surface of the electronic heat source 82 abuts against the heated surface 111 or a heat conduction medium (not shown in figures) is filled between the electronic heat source 82 and the heated surface 111.

When using, the abovementioned structure is placed in a liquid container (not shown in figures). The liquid in the liquid container is non-conductive liquid with a low boiling point. When the waste heat from the working electronic heat source 82 is directly conducted to the cooling surface 112 and each pin 21 through the heated surface 111, the waste heat is rapidly dissipated by the non-conductive liquid flowing through the cooling surface 112 and the gaps 22 between the pins 21.

Figure 4:
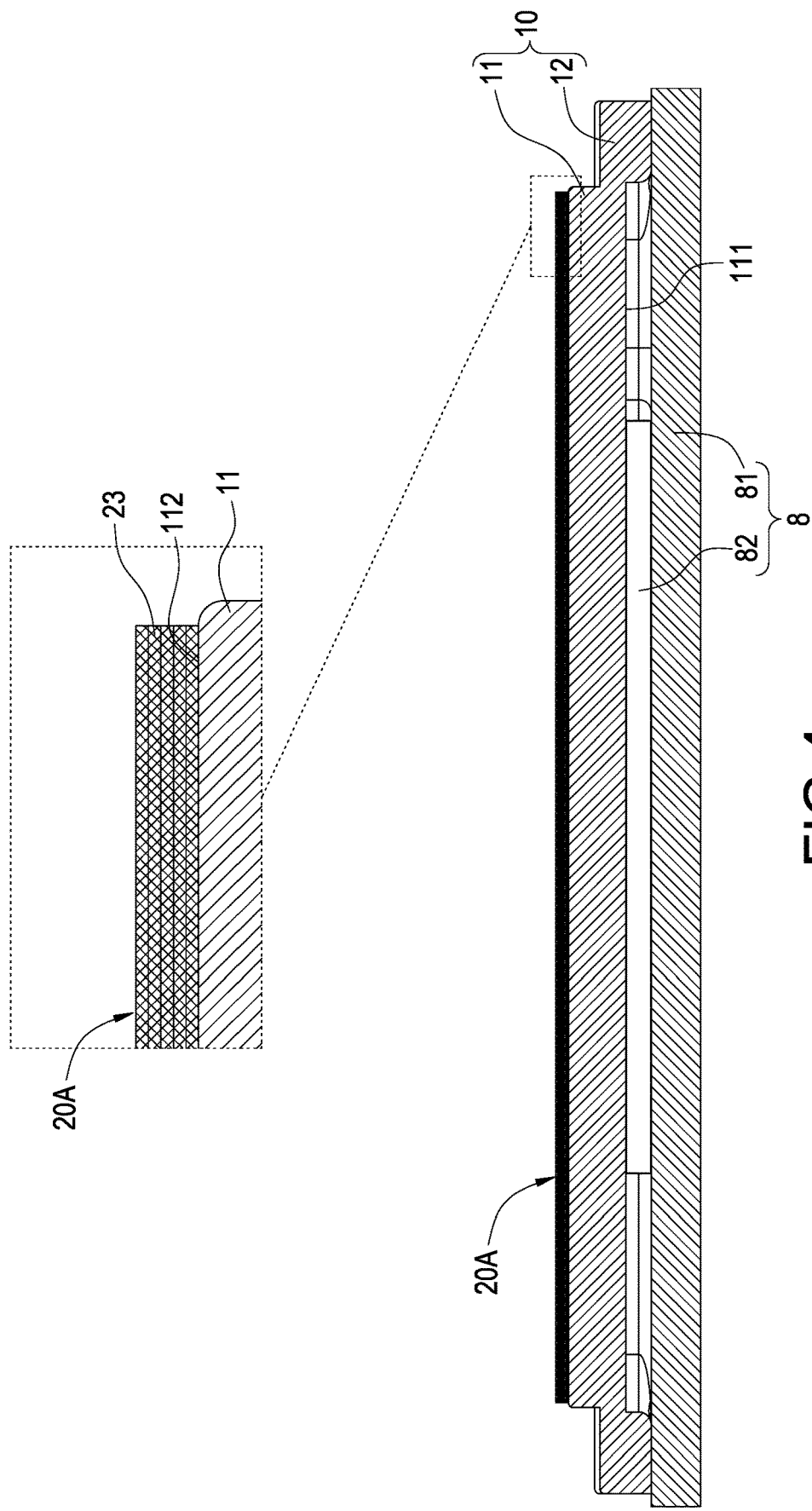
FIG. 4 is a cross-sectional view of another embodiment of the disclosure and an electronic element.

Please refer to FIG. 4. Apart from the above embodiment, the porous structure 20A of the cooling sheet with an improved surface structure for cooling the heat source in a liquid immersion manner of the disclosure may be a woven metal mesh such as a copper mesh with mesh value greater than or equal to 65 (that is, the gap is less than or equal to about 0.2 mm). In some embodiments, the mesh value is between 120 and 300. The woven metal mesh is connected to the cooling surface 112 in a diffusion bonding manner.

In one embodiment, the woven metal mesh includes multiple mesh units 23. The mesh units 23 are stacked layer by layer to be laid and assembled on the cooling surface 112. Each woven mesh unit 23 may be made of C1100 copper mesh, whose wire diameter is about 0.05 millimeter (mm), thickness is about 0.1 millimeter (mm), porosity is 50%, and thermal conductivity is greater than or equal to 390 W/mk.

Figure 5:
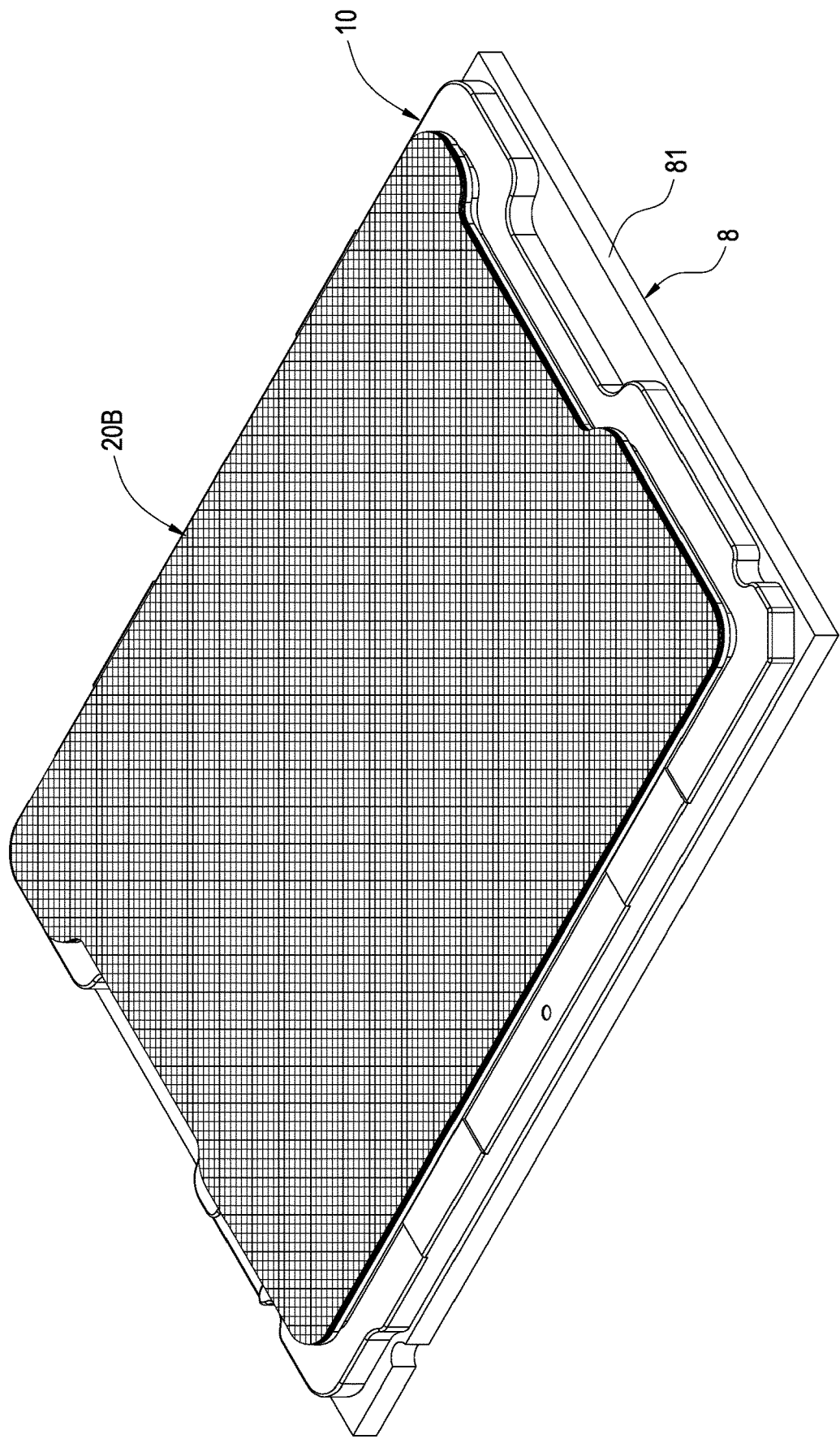
FIG. 5 is a perspective assembled of still another embodiment of the disclosure and an electronic element.
Figure 6:
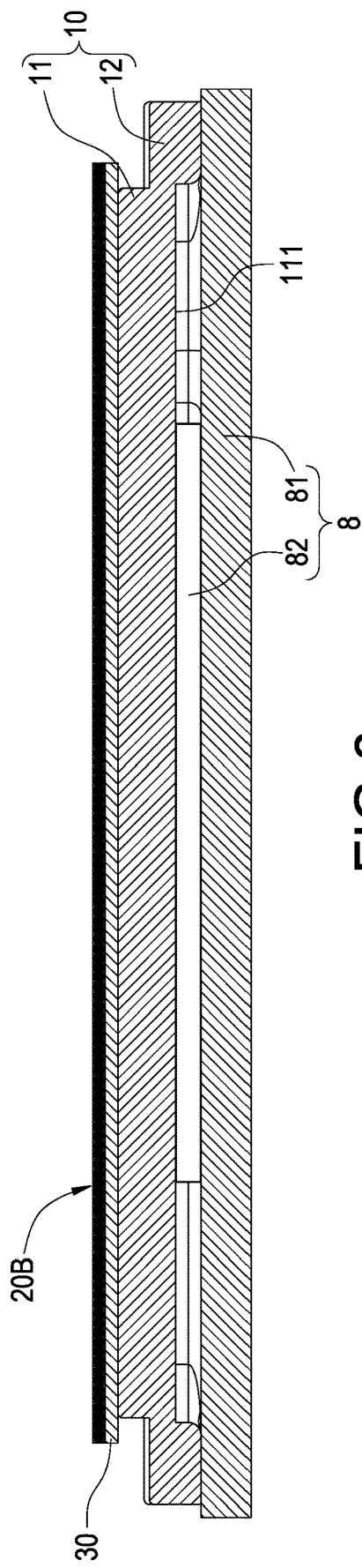
FIG. 6 is a cross-sectional view of the still another embodiment of the disclosure and an electronic element.

Please refer to FIGS. 5 and 6. The present embodiment of the cooling sheet with an improved surface structure for cooling the heat source in a liquid immersion manner of the disclosure differs from the above embodiment by further including a heat conduction plate 30 sandwiched between the cooling surface 112 of the metal case 10 and the porous structure 20B. The heat conduction plate 30 is made of copper, aluminum, magnesium or an alloy thereof. When manufacturing, the mesh units of the porous structure 20B are stacked layer by layer to be laid and assembled on the heat conduction plate 30, and then the heat conduction plate 30 and the porous structure 20B are together assembled onto the cooling surface 112 of the metal case 10.

While this disclosure has been described by means of specific embodiments, numerous modifications and variations could be made thereto by those skilled in the art without departing from the scope and spirit of this disclosure set forth in the claims.

What is claimed is:

1. A liquid immersion cooling sheet, comprising: a metal case, comprising a heated surface and a cooling surface disposed on a back of the heated surface; and a porous structure, disposed on the cooling surface, comprising multiple gaps, and a width of each gap being between about 0.05 mm and about 0.1 mm, wherein the porous structure comprises multiple pins, and each of the multiple gap is disposed between any adjacent two of the multiple pins, wherein a width or a diameter of each pin is less than or equal to 0.2 mm.

2. The liquid immersion cooling sheet of claim 1, wherein each of the multiple pin is integratedly formed with the metal case and extended from the cooling surface.

3. The liquid immersion cooling sheet of claim 1, further comprising a heat conduction plate sandwiched between the cooling surface of the metal case and the porous structure.

* * * * *